United States Patent
Ma et al.

(10) Patent No.: US 9,396,965 B2
(45) Date of Patent: Jul. 19, 2016

(54) TECHNIQUES AND APPARATUS FOR ANISOTROPIC METAL ETCHING

(71) Applicant: Varian Semiconductor Equipment Associates, Inc., Gloucester, MA (US)

(72) Inventors: Tristan Ma, Lexington, MA (US); Ludovic Godet, Sunnyvale, CA (US); Thomas R. Omstead, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/452,127

(22) Filed: Aug. 5, 2014

(65) Prior Publication Data
US 2016/0042975 A1    Feb. 11, 2016

(51) Int. Cl.
*H01L 21/3213*    (2006.01)
*H01L 21/768*     (2006.01)
*H01J 37/32*      (2006.01)

(52) U.S. Cl.
CPC ...... *H01L 21/32136* (2013.01); *H01J 37/32422* (2013.01); *H01L 21/76892* (2013.01); *H01J 2237/334* (2013.01)

(58) Field of Classification Search
None
See application file for complete search history.

(56) References Cited

U.S. PATENT DOCUMENTS

| | | |
|---|---|---|
| 5,431,774 A | 7/1995 | Douglas |
| 2001/0055649 A1 | 12/2001 | Ogure et al. |
| 2013/0075248 A1 | 3/2013 | Hara et al. |
| 2014/0262755 A1* | 9/2014 | Deshmukh ........ H01J 37/32431 204/192.35 |
| 2015/0011093 A1* | 1/2015 | Singh ................ H01J 37/32422 438/712 |

* cited by examiner

*Primary Examiner* — Asok K Sarkar

(57) ABSTRACT

In one embodiment, a method for etching a metal layer on a substrate may include providing a hydrogen-containing gas and an impurity gas to a plasma chamber; generating a plasma from the hydrogen-containing gas and the impurity gas in the plasma chamber, the plasma comprising hydrogen-containing ions; providing gaseous species from the plasma chamber to the substrate, wherein the providing the gaseous species comprises directing an ion beam comprising the hydrogen-containing ions formed from the plasma through an extraction aperture of an extraction plate disposed between the substrate and the plasma.

13 Claims, 4 Drawing Sheets

TECHNIQUES AND APPARATUS FOR ANISOTROPIC METAL ETCHING

FIELD

The present embodiments relate to substrate processing, and more particularly, to processing apparatus for etching metal layers.

BACKGROUND

As semiconductor devices scale to smaller dimensions, metal interconnects that form part of device circuitry are also scaling to smaller dimensions. In order to maintain the resistance-capacitance (RC) delay at acceptable levels it may be useful to reduce the materials resistance in a metal interconnect. However, conventional metal interconnects such as copper interconnects are formed using a dual Damascene process in which copper is deposited into patterned features where interconnect lines are to be formed. This may limit the grain size of the copper material, which may increase resistivity due to grain boundary scattering, among other phenomena. This smaller grains size may in turn raise the RC delay and hence limit the speed of the circuits.

In principle, larger-grain metal materials such as copper may be formed if a metal is deposited as a blanket layer. However, if metal is first deposited as a blanket layer, formation of interconnect wiring entails etching of the metal layer after deposition to pattern the metal layer. It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment a method for etching a metal layer on a substrate includes providing a hydrogen-containing gas and an impurity gas to a plasma chamber; generating a plasma from the hydrogen-containing gas and the impurity gas in the plasma chamber, the plasma comprising hydrogen-containing ions; and providing gaseous species from the plasma chamber to the substrate, wherein the providing the gaseous species comprises directing an ion beam comprising the hydrogen-containing ions formed from the plasma through an extraction aperture of an extraction plate disposed between the substrate and the plasma.

In another embodiment an apparatus for etching a metal layer on a substrate may include a gas source assembly to provide a gas mixture comprising a ratio of impurity gas to hydrogen gas of 0.2% to 10%. The apparatus may also include a plasma chamber configured to receive the gas mixture and generate a plasma comprising hydrogen ions and impurity ions, and an extraction plate adjacent the plasma chamber and configured to provide gaseous species from the plasma chamber to the substrate through an extraction aperture, the gaseous species comprising an ion beam containing hydrogen ions and impurity ions having trajectories that form a non-zero angle with respect to a perpendicular to a substrate plane of the substrate.

In a further embodiment, a method for etching a copper layer on a substrate may include providing a mixture comprising hydrogen-containing gas and an impurity gas to a plasma chamber. The method may also include providing an extraction plate having an extraction aperture between the plasma chamber and substrate, generating a plasma from the hydrogen-containing gas and the impurity gas in the plasma chamber, the plasma comprising hydrogen-containing ions and impurity ions, and applying an extraction voltage between the plasma chamber and substrate, wherein an ion beam comprising hydrogen-containing ions, impurity ions and hydrogen radicals are directed to the substrate.

DETAILED DESCRIPTION

Figure 1:
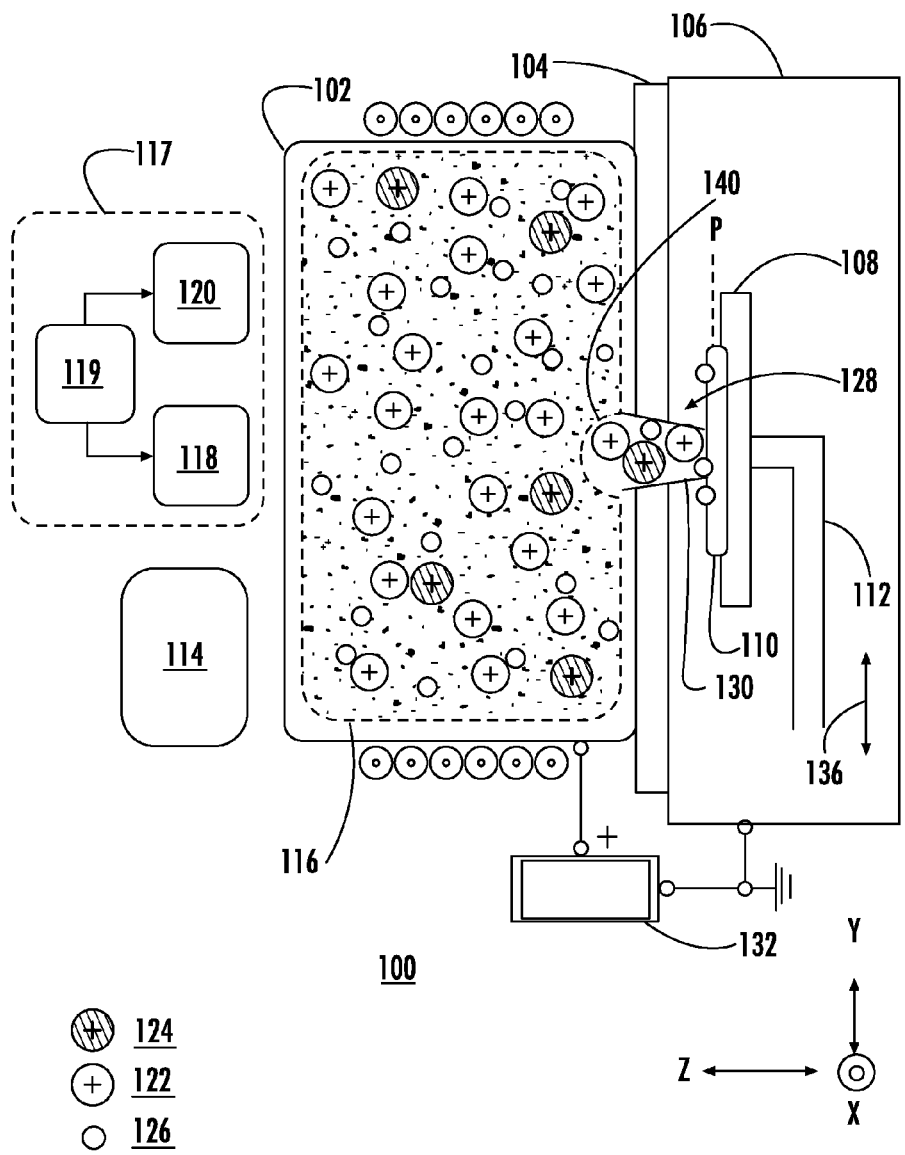
FIG. 1 illustrates a processing apparatus consistent with various embodiments of the disclosure.

The embodiments described herein provide techniques and apparatus for etching metal such as copper to form patterned features. In particular embodiments, a metal layer such as copper may be disposed, for example, as a pure copper layer or copper alloy layer on a substrate base. The copper layer may be etched in an anisotropic fashion to form a patterned feature such as an interconnect structure. The copper layer may be initially formed as a blanket layer before etching where the copper layer is composed of crystallites having relatively large grain size at least within a plane of the copper layer. The grain size within the plane of the copper layer may be larger than a dimension of a copper feature after etching. For example, a line width of a copper feature after etching may be less than one half micrometer, while a grain dimension within a plane of the copper layer before etching may be greater than one micrometer. The fabrication techniques for forming patterned copper features that are provided by the present embodiments provide a manner in which resistance may be reduced within a patterned copper feature. This is accomplished by reducing the number of grain boundaries encountered along a length of a patterned feature in comparison to conventional approaches such as dual Damascene fabrication. In the dual Damascene approach, for example, in order to fabricate a copper feature having a linewidth of 200 nm, copper is deposited within small cavities or trenches that are 200 nm wide. The processes involved in filling such narrow cavities and polishing excess metal to remove the metal where appropriate may inherently limit or reduce the grain size of such metal.

In various embodiments, a hydrogen-based plasma is used to provide gaseous species to a substrate for copper etching, which may form patterned copper structures such as interconnects. The hydrogen-based plasma may provide, for example, hydrogen ions, impurity ions, radicals, and ultraviolet radiation. Gaseous species may be directed to a substrate from a plasma chamber in which the hydrogen-based plasma is formed. In particular embodiments, the gaseous species may be provided through an extraction plate adjacent the plasma chamber. The gaseous species including hydrogen ions, impurity ions, and radicals may be directed to a substrate in such a matter that generates an anisotropic etch profile in a copper layer. Although gaseous species such as radicals may be non-ionized and have neutral charge, both radicals and ions may stream out of a plasma chamber and impact a copper layer in a manner that provides improved etching of the copper layer. This process may be effective to form a copper interconnect having a critical dimension of less than 1000 nm and in some examples 100 nm or less.

The present embodiments address the current challenges for subtractive etching of copper, copper alloys or other hard-to-etch metal films by providing novel plasma compositions and etching configurations for etching a substrate. In various embodiments, a small fraction of impurity gas is provided in addition to hydrogen to form a plasma that includes hydrogen ions and impurity ions to be directed to a copper layer. The term "impurity" as used herein with respect to gas species or ions, may refer to an additive to a main species in a hydrogen-based plasma, such as hydrogen gas or hydrogen ions, wherein the hydrogen species forms the greater fraction of gas species. By tailoring the composition of a hydrogen-based plasma as well as the geometry for providing species from the plasma to a substrate, etching of copper layers is improved in comparison to known approaches. In some instances the impurity species may form a part of a gas such an nitrogen in $NH_3$ gas.

In various embodiments, a fraction of impurity gas, such as 0.2% (0.002) to 10% (0.10) impurity gas is added to $H_2$ gas to form an etching plasma for etching copper layers. In particular embodiments, a fraction of impurity gas, such as 0.5% (0.005) to 5% (0.05) impurity gas is added to $H_2$ gas to form an etching plasma for etching copper layers. Unless otherwise noted, the terms "copper layer" or "copper" as used herein may include pure copper as well as alloys of copper. The impurity gas may include nitrogen, oxygen, fluorine, argon, neon, methane, or ammonia in some examples. The embodiments are not limited in this context.

FIG. 1 illustrates a processing apparatus 100 consistent with various embodiments of the disclosure. The processing apparatus 100 includes a plasma chamber 102 and an extraction plate 104 disposed along a side of the plasma chamber 102. The extraction plate 104 is disposed between the plasma chamber 102 and a process chamber 106, which is configured to house a substrate holder 108 and substrate 110. As illustrated, the substrate holder 108 may be movable with the aid of a stage 112 along the X-axis, Y-axis, or Z-axis, or any combination thereof with respect to the Cartesian coordinate system shown. In various embodiments, the substrate holder 108 may be configured to rotate within the X-Y plane or tilt with respect to the X-Y plane.

The processing apparatus 100 also includes a plasma source 114, which may be used to generate a plasma 116 in the plasma chamber 102. For example, the plasma source 114 may, in various embodiments, be an in situ source or remote source, an inductively coupled plasma source, capacitively coupled plasma source, helicon source, microwave source, arc source, or any other type of plasma source. The embodiments are not limited in this context.

The processing apparatus 100 includes a gas source assembly 117 that includes a gas source 118, which may supply to the plasma chamber 102 hydrogen (H2) gas in some embodiments, or a hydrogen-containing gas such as ammonia (NH3). The gas source assembly 117 may also include a gas source 120, which supplies an impurity gas such as nitrogen, oxygen, or fluorine in some examples. In operation, the processing apparatus 100 may generate a plasma 116 that contains hydrogen ions 122 as well as impurity ions 124. The hydrogen ions may be generated when hydrogen from the gas source 118 is supplied to the plasma chamber 102. In some examples gas pressure within the plasma chamber 102 may be less than 100 mTorr. The impurity ions may be generated in one instance when gas from the gas source 120 flows into the plasma chamber 102. The gas source assembly 117 may include a controller 119 that is coupled to the gas source 118 and gas source 120, and is configured to control the ratio of hydrogen gas to impurity gas in the plasma chamber 102. In addition to ions, when a plasma 116 is generated, radicals 126 may be generated in the plasma chamber 102. The radicals 126 may include hydrogen radicals that are effective to react with a copper surface as discussed below.

As suggested in FIG. 1, the hydrogen ions 122, impurity ions 124, and radicals 126 may exit the plasma chamber 102 via an extraction aperture 128 provided in the extraction plate 104. For example, the hydrogen ions 122 and impurity ions 124 may be extracted from the plasma chamber 102 and directed as an ion beam 130 to the substrate 110 when a desired extraction voltage is established between the plasma chamber 102 and substrate holder 108 using the extraction voltage supply 132. In some embodiments, the ion beam 130 may be supplied as a continuous ion beam or may be supplied as a pulsed ion beam where extraction voltage supply 132 supplies a pulsed extraction voltage. As further shown in FIG. 1 the substrate holder 108 may be scannable along a direction 136 that lies parallel to the Y-axis. In one implementation the extraction aperture 128 may be an elongated slot that has a short dimension, or aperture width, along the Y-axis that is less than the dimension of the substrate 110, as suggested by FIGS. 1A-1C, while the long dimension of the extraction aperture 128 parallel to the X-axis is equal to or exceeds the dimension of the substrate 110 along the X-axis. Accordingly, when the substrate holder 108 is scanned a sufficient distance along direction 136, the entirety of substrate 110 may be exposed to ion beam 130.

In addition to ions from the ion beam 130, radicals 126, which may include hydrogen radicals, may be supplied to the substrate 110 from the plasma chamber 102. The radicals 126 may be generated by energetic processes that take place within the plasma 116, and may be useful for the etching of copper layers as detailed below.

Figure 2:
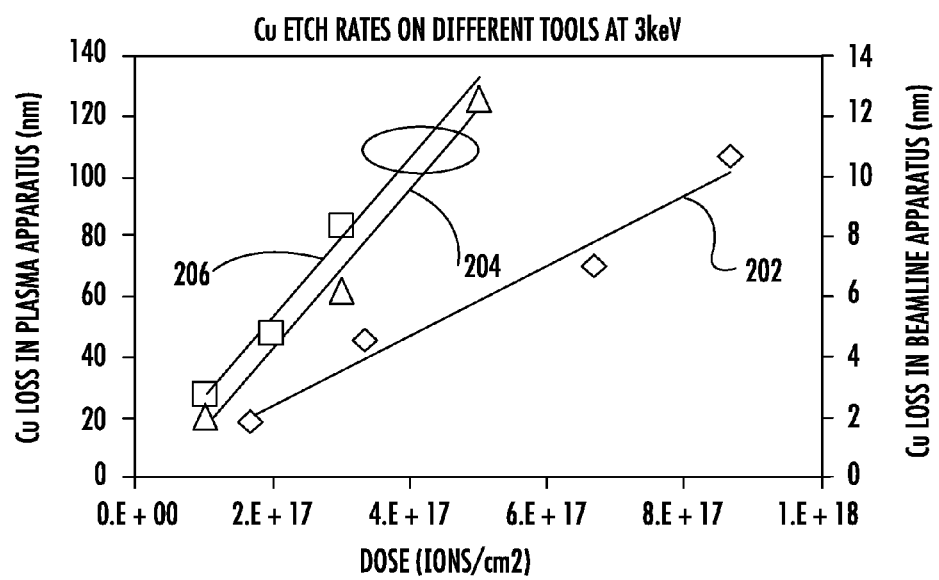
FIG. 2 depicts the etch rate results for etching of copper layers using 3 keV hydrogen ions in three different apparatus.

In particular, the present inventors have found that the etch rate of copper may be greatly enhanced using a plasma-based hydrogen-containing beam that includes impurity ions in comparison to the etch rate generated by a hydrogen ion beam provided by a beamline ion implanter. FIG. 2 depicts the etch rate results for etching of copper layers using 3 keV hydrogen ions in three different apparatus. The etch rate is shown as a total amount of layer thickness removed as a function of ion dose provided to a copper layer. The curve 202 represents etched copper thickness using a beamline ion implanter. In a beamline ion implanter the ion beam provided to a substrate is mass analyzed so that just a particular ion mass is provided to the substrate, which in this case represents $H_2^+$. The etch rate given by curve 202 suggests that between 11 and 12 nm of copper are etched for an ion dose of $1E18/cm^2$. This etching may be due to sputtering of the copper by energetic hydrogen ions, which is a physical process that entails momentum transfer between the incident ions and atoms within the copper layer being exposed to the ion beam.

It is to be noted that the total amount of copper (11 nm) removed after the copper layer is subjected to a high dose of $1E18/cm^2$ hydrogen ions is relatively low. Accordingly, it will be appreciated that the use of a hydrogen ion beam of pure hydrogen may be ineffective to etch copper at an etch rate that is compatible with a commercially viable process. Further tests were conducted to determine etch behavior of copper when subjected to plasma-based apparatus in which a substrate is located proximate the plasma. In this type of apparatus, because mass analysis of ions may not be performed, ions of different mass or mass/charge ratio as well as free radicals may be simultaneously provided to the substrate. The present inventors have in particular investigated the copper etch behavior when a small amount of impurity gas is added to a hydrogen gas to form a plasma that is used as a source of copper etching. Curve 204 illustrates the copper etch rate when a copper layer is subjected to ions in a conventional plasma immersion tool in which the substrate is placed in a hydrogen plasma formed when nitrogen gas is added to hydrogen gas where the partial pressure of the nitrogen gas is 2.5%. As can be seen, the copper etch rate is greatly enhanced so that 130 nm of copper are etched by an ion dose of $5E17/cm^2$. Curve 206 illustrates the copper etch rate when a copper layer is subjected to ions provided in an apparatus arranged according to the embodiment of FIG. 1. In this example a hydrogen-based plasma is formed in a plasma chamber when nitrogen gas is added to hydrogen gas where the partial pressure of the nitrogen gas is 2.5%. An ion beam is then extracted from the plasma chamber and directed to a copper layer in an adjacent process chamber. Radicals may also diffuse out of the plasma chamber and participate in etching of the copper layer. As can be seen, the copper etch rate is enhanced so that 140 nm of copper are etched by an ion dose of $5E17/cm^2$. This corresponds to an effective etch rate of copper of greater than one atom of copper per ion.

This enhancement may be caused in part by the presence of species such as hydrogen based radicals, which may form in a plasma chamber in addition to the hydrogen ions and impurity ions. Such radicals, which may carry no charge, nevertheless may impinge upon the copper surface and may interact with the copper layer to increase copper etching as discussed below with respect to FIGS. 3A-3C. On the other hand, the present inventors have found that when a hydrogen plasma that is generated remotely from a substrate with no extraction bias applied, no etching of copper takes place. Accordingly, the present embodiments employ techniques and apparatus that provide energetic hydrogen ions and radicals to a substrate together with impurity ions in order to carry out copper etching.

Figure 3A:
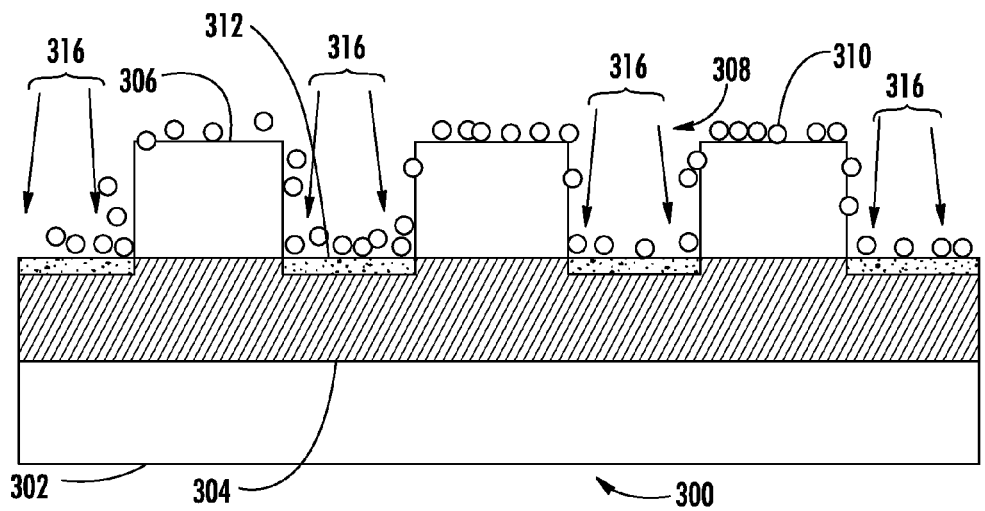
FIG. 3A, FIG. 3B, and FIG. 3C depict three different instances during copper etching according to various embodiments of the disclosure.
Figure 3B:
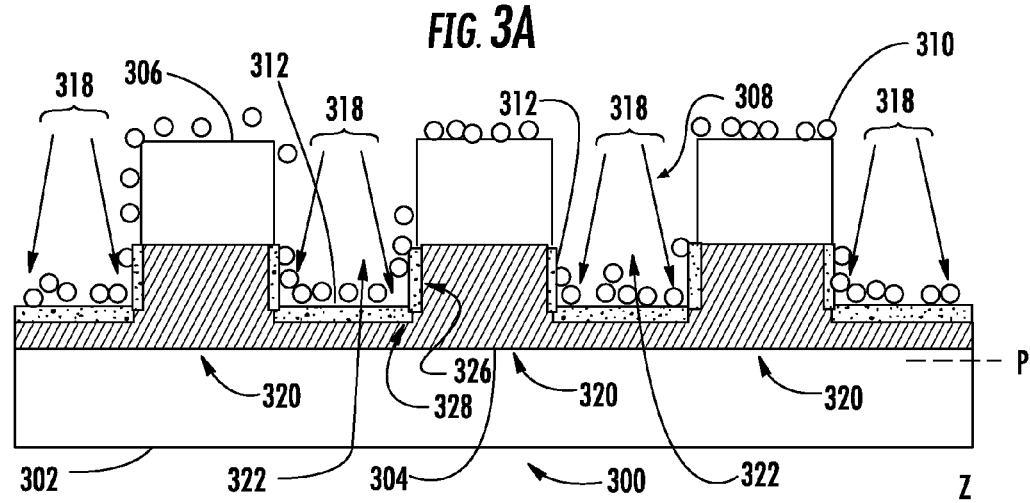
Figure 3C:
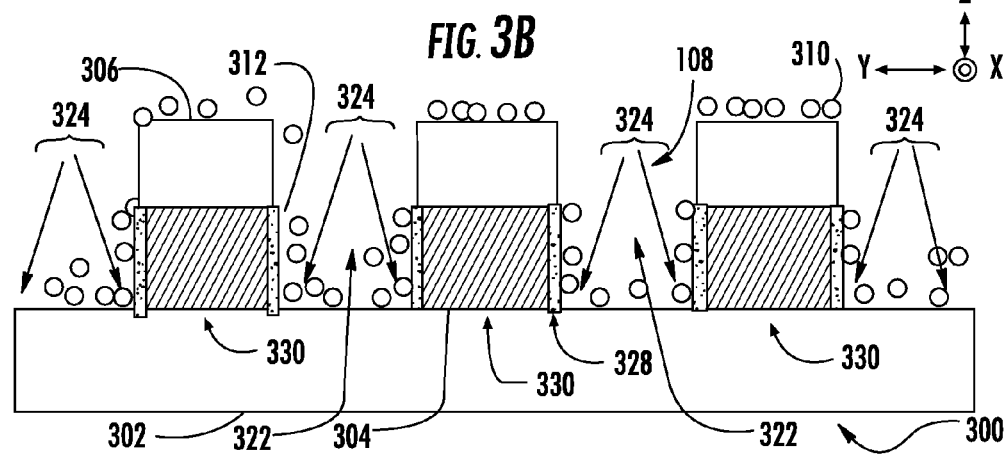

FIG. 3A, FIG. 3B, and FIG. 3C depict three different instances during copper etching according to various embodiments of the disclosure. In FIG. 3A there is shown a substrate 300 having a substrate base 302 upon which a copper layer 304 is disposed. The substrate base may be an insulator, semiconductor or other metal, for example. In some embodiments the thickness of the copper layer 304 may be several micrometers or less, and in some cases the thickness may be less than one half micrometer, or less than 200 nm. However, the embodiments are not limited in this context. In order to pattern the copper layer 304 by etching, a mask having mask features 306 is disposed on the copper layer 304. As shown in FIG. 3A ions 308 are directed to the substrate 300 while the mask features 306 are in place. The mask features may be for example, a photoresist, a metal, oxide, nitride, or other material that is different than copper. The mask features 306 may intercept the ions 308 so as to prevent the ions from striking regions of the copper layer 304 that lie beneath the mask features 306. The ions 308 may contain a mixture of hydrogen ions and impurity ions, such as nitrogen ions, oxygen ions, or fluorine ions. However, the embodiments are not limited in this context.

In order to generate etching of the copper layer 304, in some embodiments, the ions 308 may be directed to the substrate 300 with an energy of 10 keV or less. As discussed above with respect to FIG. 1, this energy may be supplied by generating a voltage difference between a plasma chamber and a substrate chamber or substrate holder within the substrate chamber, which may be at the same potential as the substrate chamber in some instances. As further illustrated in FIG. 3A radicals 310 also impinge upon the substrate 300 and may strike various surfaces of the substrate 300. These radicals may be hydrogen radicals that form in a plasma chamber when the ions 308 are generated. The radicals 310 may have relatively low kinetic energy such as below 1 eV since the radicals 310 may carry no charge and may therefore stream out of a plasma chamber toward the substrate 300 without experiencing an accelerating field (not shown) that is imparted to the ions 308. However, the radicals 310 may be effective to form a surface layer 312 on an outer surface of the copper layer 304. The surface layer 312 may be a semi-volatile copper hydride or a volatile copper hydride whose thickness is a few nanometers or less in some cases, such as one nanometer or less. In the absence of energetic bombardment by ions or other species such a surface layer 312 may be insufficiently volatile to cause appreciable etching of the copper layer 304. For example, after forming a surface layer 312 of a given thickness, such as 1-2 nm, a copper hydride may self-passivate the surface of a copper layer such that the thickness of the copper hydride layer does not continue to grow. Accordingly, if the copper hydride is insufficiently volatile little of no effective etching of copper may take place.

However, the surface layer 312 may be subject to etching by the ions 308 such that copper is removed. Thus, radicals 310 may form a surface layer 312 that is subject to etching by ions 308. These different processes may interact to continuously etch the copper layer 304. In other words, hydrogen radicals may act to form a copper hydride layer as represented by the surface layer 312, while ions 308 may be effective to remove the surface layer 312 including copper atoms in that layer. The removal of the copper hydride layer by ions 308 may thus expose a fresh copper surface that is reacted with additional hydrogen radicals to form additional copper hydride, which is subject to etching by the ions 308, and so on. In addition, vacuum ultraviolet photons (not shown) may also be generated in a plasma and directed to the substrate 300 to further assist in etching of the copper layer 304.

It is to be noted that gas mixtures in which a small fraction of impurity gas is added to hydrogen gas, such as 0.5% to 5%, may generate ions 308 that produce an enhanced copper etch rate as shown in FIG. 2. In particular, the ions 308 may include a mixture of hydrogen ions as well as impurity ions. In some examples, the hydrogen ions may comprise a mixture a mixture of atomic hydrogen ions and molecular hydrogen ions, such as a mixture of $H_2^+$, $H_3^+$, and $H^+$. The higher mass molecular hydrogen ions such as $H_3^+$ may be more effective in removing the surface layer 312 than $H^+$, for example, and may therefore contribute to an increased copper etch rate.

Turning now to FIG. 3B there is shown a later instance of etching the copper layer 304 in which features 320 have been defined by etching of the copper layer in the presence of the mask features 306. In various embodiments, the ions 308 and radicals 310 may selectively etch the copper layer 304 with respect to the mask features 306 such that the etch rate of copper layer 304 is greater than that of mask features 306. At the instance depicted in FIG. 3B, the copper layer 304 has been partially etched such that a portion of the copper layer 304 remains in the open regions 322 that are not covered by the mask features 306. As further illustrated in FIG. 3B the ions 308 and radicals 310 may etch the copper layer 304 in an anisotropic manner such that vertical etching along a direction parallel to the Z-axis is greater than horizontal etching along a direction parallel to the Y-direction. This creates the features 320 in the copper layer 304, which in some instances may mimic the size and shape of mask features 306 within the X-Y plane.

Referring again also to FIG. 1, in particular embodiments, the ions 308 and radicals 310 may be provided by the processing apparatus 100. In some embodiments, the extraction plate 104 may be configured to modify the shape of a plasma sheath boundary 140, which may create, for example, a convex shape of the plasma sheath boundary 140 near the extraction aperture 128 with respect to a plane P of the substrate 110. When ions such as the ions 308 are extracted through the extraction aperture 128, the ions 308 may exit the plasma sheath boundary 140 along different trajectories by virtue of the curvature of the plasma sheath boundary 140, such that the ions assume trajectories over a range of angles of incidence with respect to a perpendicular (not shown) to the plane P, which perpendicularly lies along the Z-axis. By varying process conditions including plasma power to generate the plasma 116, extraction voltage, gas pressure within plasma chamber 102, size of the extraction aperture along the Y-axis, among other features, the exact shape of the plasma sheath boundary may be adjusted. In this manner, the ion angular distribution of ions 308 may also be adjusted. The term "ion angular distribution" (IAD) refers to the mean angle of incidence of ions in an ion beam with respect to a reference direction such a perpendicular to a substrate, as well as to the width of distribution or range of angles of incidence centered on the mean angle, termed "angular spread" for short. The ion angular distribution may involve a mean angle for ion trajectories of the ion beam that forms a non-zero angle with respect to a perpendicular to the plane P of the substrate. In various embodiments, the ion angular distribution of an ion beam may be adjusted by adjusting alone or in combination settings in a processing apparatus such as processing apparatus 100, where the settings include RF power supplied to a plasma chamber that generates the ions, extraction voltage used to accelerate ions to a substrate, gas pressure in a plasma chamber, extraction aperture width, and other settings as known.

The ability to tailor the IAD of the ions 308 may facilitate tailoring the etch process for etching copper in accordance with the size, shape, and thickness of copper features to be etched. For example, as etching proceeds, redeposition of copper-containing species may cause the shape of a copper feature being etched to deviate from a desired shape. One manner to address this situation is to tailor the ion angular distribution of ions 308 so that copper etching is selectively emphasized in some regions as opposed to others.

In some implementations, and as illustrated in FIGS. 3A and 3B, the ion angular distribution of ions 308 may be dynamically adjusted during etching. As shown in FIG. 3A, for example, at an initial stage of etching, ions 308 may be directed to the substrate 300 with an ion angular distribution 316. For the purposes of illustration it may be assumed that the ion angular distribution 316 is characterized by a narrow distribution of angles of incidence centered on a perpendicular to the plane P. This IAD may be effective to rapidly etch the copper layer 304, which may present a planar surface that is parallel to the plane P during initial etching. At a subsequent etching stage shown in FIG. 3B, the copper layer 304 has been etched to define features 320 which have developed sidewalls 326 and corner regions 328. As also shown in FIG. 3B, surface layers 312 have formed along the sidewalls 326 due to the impingement of radicals 310, which may strike the substrate including sidewalls 326 having less directionality than the ions 308. Thus, once the copper layer 304 has been etched in the open regions 322, surface layers 312 may form on copper surfaces that are not parallel to the X-Y plane. As etching proceeds, in order to impart the desired profile to the features 320, it may be desirable to concentrate ions 308 in certain portions of the surface layers 312 as opposed to other portions. In one instance, an ion angular distribution 318 may be imparted into the ions 308 that is different than ion angular distribution 316. In one example, the ion angular distribution 318 may be broader than the ion angular distribution 316. This may provide ions 308 with some trajectories that deviate further from perpendicular to the plane P, and thus may be more effective in reaching certain portions such as corner regions 328. In some examples, the ion angular distribution 318 may be a bimodal distribution of angles of incidence. For example, the ions 308 in the example of FIG. 3B may have trajectories that are centered around two angular modes at +/−30 degrees with respect to perpendicular to the plane P.

At a still later instance shown in FIG. 3C, the features 320 may be completely etched to the substrate base 302, forming the isolated features 330 as shown. At this stage, another ion angular distribution 324 may be imparted into ions 308 as shown. In this case, the ion angular distribution 324 may be broader than the ion angular distribution 318. This may be appropriate to direct a higher fraction of ions 308 to the corner regions 328 and sidewalls of the isolated features, which may include residual amounts of surface layer 312.

Figures 4A, 4B:
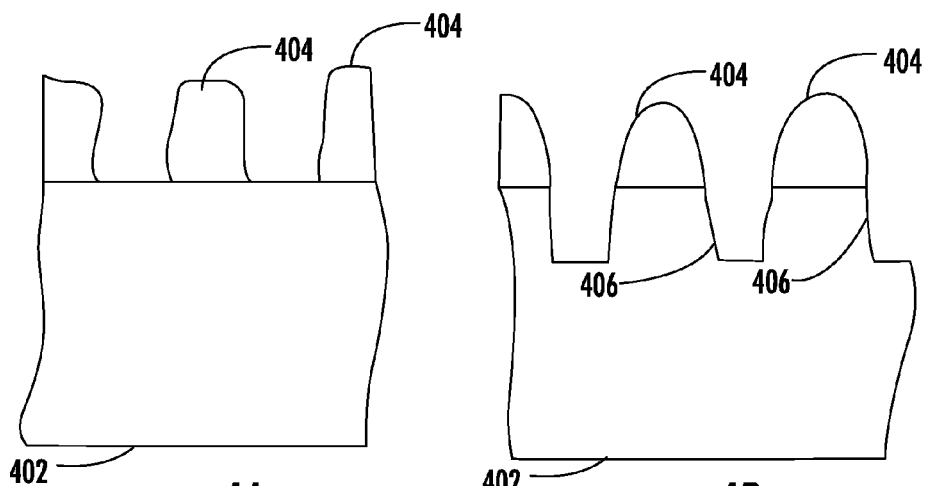
FIG. 4A depicts an exemplary hardmask features disposed on a copper layer before etching.
FIG. 4B depicts a profile of the copper layer of FIG. 4A and hardmask features after etching using an apparatus and process in accordance with embodiments of the disclosure.

FIG. 4A depicts exemplary hardmask features, indicated as hardmask features 404, which are disposed on a copper layer 402 before etching while FIG. 4B depicts a profile of the copper layer 402 and hardmask features 404 after etching using an apparatus and process in accordance with embodiments of the disclosure. The cross-sectional views are based upon electron microscopy images recorded from a 200 nm thick copper layer subjected to etching in a processing apparatus in which a beam of ions were extracted from a plasma formed from a gas mixture of $N_2/H_2$ in which the $N_2$ formed 2.5 molar % of the gas mixture, meaning that a ratio of $N_2/(N_2+H_2)$ is 0.025. In this example, an initial thickness of hardmask features 404 is 70 nm. After etching, as shown in FIG. 4B, the copper layer 402 to a depth of 50 nm, copper features 406 are formed. The copper features 406 are representative of an anisotropic etch process although in some instances the sidewalls of copper features 406 may not be completely vertical. In addition the thickness of the hardmask features 404 is reduced to 50 nm after etching. Thus, the process exemplified in FIGS. 4A and 4B exhibits an etch selectivity of copper with respect to hardmask material.

Figures 5A, 5B, 5C:
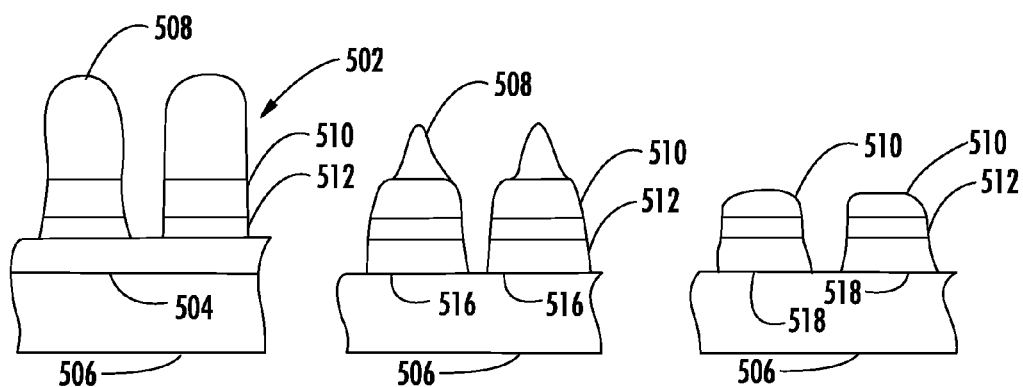
FIG. 5A, FIG. 5B, and FIG. 5C together depict examples of copper etching according to further embodiments of the disclosure.

FIG. 5A, FIG. 5B, and FIG. 5C together depict examples of copper etching according to further embodiments of the disclosure. In this case, a layer stack 502 is initially disposed on a copper alloy layer 504, which is disposed in turn on a substrate base 506 composed of nitride. The layer stack includes a hardmask layer 508, nitride layer 510, and tungsten layer 512. The cross-sectional view show in FIG. 5B is based upon an electron microscopy image recorded when the copper alloy layer 504 was subjected to etching in a processing apparatus in which a beam of ions were extracted from a plasma formed from a gas mixture of $N_2/H_2$ in which the $N_2$ formed 2.5 molar % of the gas mixture. In particular, FIG. 5B illustrates the results after the entirety of copper alloy layer 504 was etched to expose the underlying substrate base 506. In this example, the etched copper features 516 have reasonably vertical sidewalls. In addition, although a large fraction of the hard mask layer 508 has been etched, the underlying nitride layer 510 has not been etched.

The cross-sectional view show in FIG. 5C is based upon an electron microscopy image recorded when the copper alloy layer 504 was subjected to etching in a plasma immersion processing apparatus in which the plasma is formed from a gas mixture of $N_2/H_2$ in which the $N_2$ formed 2.5 molar % of the gas mixture. In particular, FIG. 5C also illustrates the results after the entirety of copper alloy layer 504 was etched to expose the underlying substrate base 506. In this example, the etched copper features 518 have reasonably vertical sidewalls, and the etch rate was observed to be acceptably rapid as indicated by the results shown in FIG. 2. However, the hard mask layer 508 has been completely etched, and the underlying nitride layer 510 has been partially etched.

The above results illustrate when $N_2/H_2$ gas chemistry in a plasma-based etching apparatus is maintained in a range that provides rapid copper etch rates, the use of a ion beam extracted from a plasma type apparatus such as that shown in FIG. 1 may afford better etch selectivity of copper with respect to at least some mask materials. It is believed that the processing apparatus 100 may generate a higher concentration of $H_3^+$ ions than a conventional plasma immersion apparatus, and may thus provide a higher fraction of $H_3^+$ ions to a substrate. Because of their higher mass, the higher fraction of $H_3^+$ ions may increase the effectiveness of removing a surface copper hydride layer as noted above. In some particular examples, such as the use of tantalum (Ta) as a hard mask, the etch selectivity of Cu with respect to Ta that is generated by a processing apparatus of the present embodiments may be greater than 2, meaning that copper is etched more than twice as fast as Ta.

In additional embodiments, to further improve the etch rate of copper layers the substrate temperature of the substrate containing a copper layer may be set at an elevated temperature, such as >180° C. to accelerate removal of a semi-volatile etch byproducts. In further embodiments, a low substrate temperature, such as below 20° C., may be employed to increase selectivity.

In yet another embodiments the gas composition of gases supplied to a plasma chamber may be dynamically varied during etching of a copper layer. For example, the etch process may start using a $H_2$ feed gas to supply the majority of gas species with the addition of up to several percent impurity gas. This may be useful to generate a rapid etch rate of the copper layer as described above. Subsequently, the fraction of impurity gas may be reduced or eliminated while a fraction of inert gas is added to the hydrogen gas to complete the etch process. The addition of Ar at the end of the process may remove any potential sidewall redeposition material that results from earlier stages of etching, and may remove residual impurity atoms form the etched copper features (e.g., N and O) to avoid compromising the film properties. In particular embodiments, the angles of incidence of inert gas ions such as Ar that are extracted through an extraction aperture and provided to the substrate at this later stage of etching may be controlled to improve the cleaning process. For example, better results may be achieved using an ion beam having Ar ions that have a bimodal distribution of angles of incidence where the mode angle is greater than +/−20° with respect to perpendicular.

In summary, the present embodiments address multiple challenges presented for etching of copper structures in scaled devices. The use of a minor fraction of impurity gas additives, such as 2.5% added to a hydrogen plasma has been found to be effective in increasing copper etch rate to values that are comparable to commercially viable etch process for non-copper etching, and may thus yield a competitive and commercial copper etch process. Notably, the additional impurity gas or gasses added to the main hydrogen gas may or may not be reactive, since the major role played by impurity gas is to accelerate the removal of copper hydrides and thus to increase the overall Cu etch rate. Examples of such an impurity gas include, but are not limited to, $N_2$, $O_2$, $F_2$, Ar, $CH_4$, $NH_3$, and Ne. The choice of the impurity gas and its ratio to $H_2$ is useful, moreover, in order to maintain an anisotropic etching profile. Under circumstance of too little addition of an impurity gas, such as below a few tenths of one percent, may fail to increase copper etch rate significantly over pure hydrogen plasmas. However, if impurity gas composition is too high, such as above 10%-20%, the copper etch profile and etch selectivity is significantly compromised. The present embodiments also cover etching of additional metals in which a combination of hydrogen ions, impurity ions, and radicals may be used to form metal hydride layers that are etchable in the presence of ions.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method for etching a metal layer on a substrate, comprising:
providing a hydrogen-containing gas and an impurity gas to a plasma chamber;
generating a plasma from the hydrogen-containing gas and the impurity gas in the plasma chamber, the plasma comprising hydrogen-containing ions; and
providing gaseous species from the plasma chamber to the substrate, wherein the providing the gaseous species comprises directing an ion beam comprising the hydrogen-containing ions formed from the plasma through an extraction aperture of an extraction plate to the substrate, wherein the hydrogen-containing gas is $H_2$, and the impurity gas is nitrogen ($N_2$), the method comprising providing a mixture of $N_2/H_2$ to the plasma chamber.

2. The method of claim 1, wherein the hydrogen-containing ions comprise a mixture of atomic hydrogen ions and molecular hydrogen ions.

3. The method of claim 1, wherein the gaseous species comprise hydrogen radicals that are effective to generate a metal hydride layer at a surface of the metal layer.

4. The method of claim 1, wherein a ratio of $N_2/(N_2+H_2)$ is 0.002 to 0.10.

5. The method of claim 1, further comprising adding the impurity gas at a first instance during the directing the ions, removing the impurity gas from the plasma at a second instance subsequent to the first instance, and adding inert gas to the plasma at a third instance subsequent to the first instance.

6. The method of claim 1 further comprising directing the ions at a non-zero angle with respect to a perpendicular to a substrate plane.

7. The method of claim 1, wherein the directing the ions comprises modifying a shape of a plasma sheath boundary proximate the extraction aperture using the extraction plate, wherein the ions are directed to the substrate over an ion angular distribution that comprises a range of angles of incidence.

8. The method of claim 7, comprising dynamically adjusting the ion beam wherein the ion beam has a first ion angular distribution at a first instance and a second ion angular distribution at a second instance subsequent to the first instance.

9. The method of claim 1 wherein the metal is copper, wherein an effective etch rate of the ion beam is greater than 1 atom of copper per ion.

10. The method of claim 9, wherein the gaseous species provide an etch selectivity of Cu with respect to Ta that is greater than 2.

11. A method for etching a copper layer on a substrate, comprising:
   providing a mixture comprising hydrogen-containing gas and an impurity gas to a plasma chamber;
   providing an extraction plate having an extraction aperture between the plasma chamber and substrate;
   generating a plasma from the hydrogen-containing gas and the impurity gas in the plasma chamber, the plasma comprising hydrogen-containing ions and impurity ions;
   applying an extraction voltage between the plasma chamber and substrate, wherein
   gaseous species comprising an ion beam containing hydrogen-containing ions and impurity ions, and hydrogen radicals are directed from the plasma chamber through the extraction plate to the substrate,
   wherein a ratio of the impurity gas to hydrogen-containing gas is 0.2% to 10%.

12. The method of claim 11, wherein the mixture is a mixture of $N_2$ gas and $H_2$ gas, wherein a ratio of $N_2/N_2+H_2$) is 0.005 to 0.05.

13. The method of claim 11, wherein the gaseous species comprise hydrogen radicals that are effective to generate a metal hydride layer at a surface of the metal layer, and wherein the hydrogen ions are effective to remove the metal hydride layer.

* * * * *